United States Patent
Liu et al.

(10) Patent No.: US 12,423,499 B1
(45) Date of Patent: Sep. 23, 2025

(54) RESISTANCE AND CAPACITANCE AWARE PREFERRED LAYER TRIMMING

(71) Applicant: Cadence Design Systems, Inc., San Jose, CA (US)

(72) Inventors: Derong Liu, Austin, TX (US); Mehmet Can Yildiz, Austin, TX (US); Charles Jay Alpert, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 693 days.

(21) Appl. No.: 17/845,639

(22) Filed: Jun. 21, 2022

(51) Int. Cl.
*G06F 30/3947* (2020.01)
*G06F 30/373* (2020.01)
*G06F 30/392* (2020.01)

(52) U.S. Cl.
CPC ........ *G06F 30/3947* (2020.01); *G06F 30/373* (2020.01); *G06F 30/392* (2020.01)

(58) Field of Classification Search
CPC ... G06F 30/3947; G06F 30/392; G06F 30/373
USPC ......................................................... 716/129
See application file for complete search history.

(56) References Cited

U.S. PATENT DOCUMENTS

| 7,992,122 | B1 * | 8/2011 | Burstein | G06F 30/394 |
| | | | | 703/19 |
| 10,599,882 | B1 * | 3/2020 | Werkheiser | G06F 30/392 |
| 11,113,443 | B1 * | 9/2021 | Chang | G06F 30/20 |
| 2004/0237058 | A1 * | 11/2004 | Teng | G06F 30/398 |
| | | | | 716/115 |
| 2017/0206286 | A1 * | 7/2017 | Lee | G06F 30/394 |

* cited by examiner

*Primary Examiner* — Jack Chiang
*Assistant Examiner* — Suchin Parihar
(74) *Attorney, Agent, or Firm* — Schwegman Lundberg & Woessner, P.A.

(57) ABSTRACT

Aspects of the present disclosure address systems and methods for layer trimming based on resistance and capacitance (RC) values. Data describing an integrated circuit (IC) design is accessed. The IC design comprises a net and a set of routing layers. A first and second list are generated based on the set of layers. The first list comprises horizontal routing layers and the second list comprises vertical routing layers from the set of routing layers. A permitted range of RC values for routing layers in the IC design are determined. The first and second lists are filtered based on the permitted range of RC values. The first and second filtered lists are merged to create a third list of routing layers. The net is assigned to one or more routing layers selected from the third list for routing purposes.

20 Claims, 6 Drawing Sheets

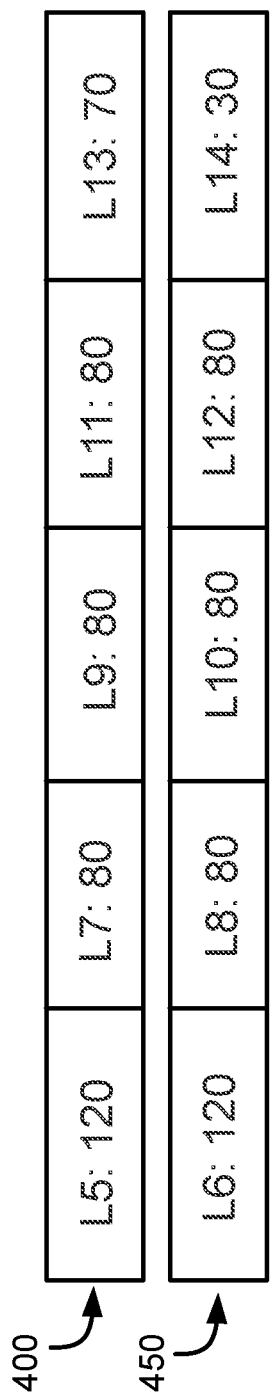
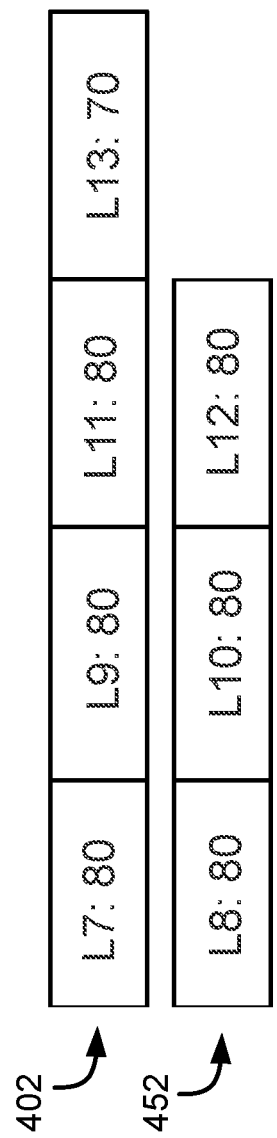
FIG. 4A
FIG. 4B

RESISTANCE AND CAPACITANCE AWARE PREFERRED LAYER TRIMMING

TECHNICAL FIELD

The present disclosure generally relates to the technical field of integrated circuit (IC) design. In particular, the present disclosure addresses systems and methods for resistance and capacitance (RC) aware layer trimming during routing layer assignment.

BACKGROUND

An integrated circuit (IC) comprises cells of similar and/or various sizes, and connections between or among the cells. A cell includes several pins interconnected by wires to pins of one or more other cells. A design netlist describes the logical connectivity between cells in an IC design. A netlist can include a set of nets and each net includes two or more interconnected pins in the IC design.

Design engineers design ICs by transforming circuit descriptions of the ICs into geometric descriptions, called layouts. To create layouts, design engineers typically use electronic design automation (EDA) applications. These applications provide sets of computer-based tools for creating, editing, and analyzing IC design layouts.

EDA applications create layouts by using geometric shapes that represent different materials and devices on IC's. For instance, EDA tools commonly use rectilinear lines to represent the wire segments that interconnect the IC components. These tools also represent electronic and circuit IC components as geometric objects with varying shapes and sizes.

BRIEF DESCRIPTION OF THE DRAWINGS

Various ones of the appended drawings merely illustrate example embodiments of the present inventive subject matter and cannot be considered as limiting its scope.

FIGS. 4A and 4B are conceptual diagrams illustrating a first example of RC-aware layer trimming, according to some example embodiments.

DETAILED DESCRIPTION

Figure 1:
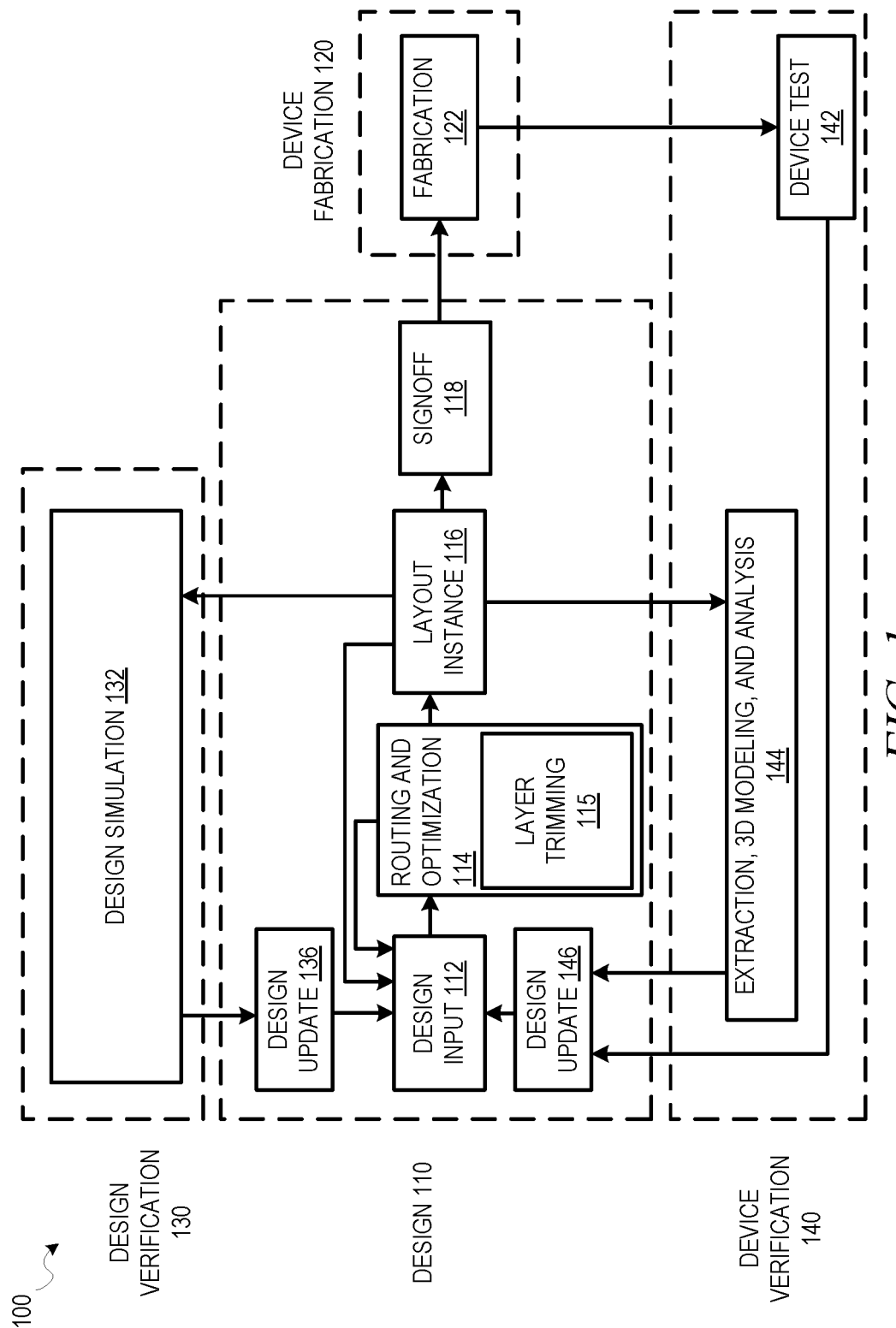
FIG. 1 is a diagram illustrating an example IC design process flow that includes RC-based layer trimming, according to some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The IC design process generally entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit components; (4) routing, which completes the interconnections between or among the circuit components by determining precise connection paths for each net; and (5) verification, which checks the layout to ensure that it meets design and functional requirements.

As noted above, routing is a key operation in the physical design cycle. Advanced IC designs can comprise multiple layers in which routing can be performed. Within each layer, routing is typically performed in a single direction-either in a horizontal direction or a vertical direction. Layers in which routing is performed in the horizontal direction are referred to as "horizontal layers" and layers in which routing is performed in the vertical direction are referred to as "vertical layers." The multiple layers of IC designs are often arranged with alternative horizontal and vertical layers such that a horizonal layer is consecutive (adjacent) with a vertical layer. Routing often includes a layer assignment process whereby nets are assigned to one or more layers to limit routing of the net to the assigned layers.

Certain routing layers can be designated as preferred routing layers for clock nets. Designations of preferred routing layers can be based on user input. Conventionally, consecutive layers with large differences in resistance and capacitance values are filtered out during layer assignment, despite designations as preferred routing layers. That is, nets are generally not assigned to adjacent layers with large differences in resistance and capacitance values. However, these conventional approaches to layer assignment are limited in that they do not consider routing direction and are dependent on exact resistance and capacitance (RC) values that can be easily impacted by slight changes to design parameters.

Aspects of the present disclosure address problems with conventional approaches to layer assignment by performing RC-based layer trimming in which a set of layers to which nets are to be assigned are filtered based on RC values prior to layer assignment. That is, rather than performing layer assignment based on a complete set of layers designated for routing, layer assignment is performed based on a subset of layers in which one or more layers from the complete set have been removed based on RC values associated with the layers. Accordingly, it shall be appreciated that "layer trimming" is also referred to herein as "layer filtering."

Consistent with some embodiments, a method corresponding to this improved approach to layer assignment comprises accessing data describing an integrated circuit design that includes a net and a set of layers. A first list comprising horizontal layers from the set of layers is generated and sorted based on RC values of the horizontal layers. A second list comprising vertical layers from the set of layers is generated and sorted based on RC values of the vertical layers. The method further includes generating an RC constraint for filtering layers based on a reference value and a maximum difference parameter. The RC constraint comprises a permitted range of RC values. The maximum difference parameter specifies a maximum permitted difference between an RC value of a layer and the reference value.

The reference value corresponds to an RC value of one of the layers. The method further includes filtering the first list and the second list based on the RC constraint. In filtering the lists, layers that fail to satisfy the RC constraint are removed. A third list of routing layers for use in layer assignment is created by merging the filtered first and second lists. The third list comprises a subset of the layers, including both horizontal and vertical layers, that satisfy the RC constraint. During layer assignment, the net is assigned to one or more routing layers selected from the third list.

Performing filtering of layers prior to layer assignment in accordance with the methodology described above and herein ensures that all layers to which nets of an IC design may be assigned for routing are within a certain RC range without any large differences in RC values among routed layers. Even if the RC values change slightly, the subset of routing layers creating through filtering remain the same, despite the changes.

FIG. 1 is a diagram illustrating an example IC design process flow that includes RC-aware layer trimming, according to some embodiments. As shown, the design process flow 100 includes a design phase 110, a device fabrication phase 120, a design verification phase 130, and a device verification phase 140. The design phase 110 involves an initial design input operation 112 where the basic elements and functionality of a device are determined, as well as revisions based on various analyses and optimization of a circuit design. This design input operation 112 is where block instances are used in the circuit design and any additional circuitry for the design around the blocks is selected. The initial strategy, tactics, and context for the device to be created are also generated in the design input operation 112, depending on the particular design algorithm to be used.

In some embodiments, following an initial selection of design values in the design input operation 112, routing and optimization are performed at operation 114, along with any other automated design processes. While the design process flow 100 shows the routing and optimization operation 114 occurring prior to a layout instance 116, routing and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118 discussed below.

The routing and optimization operation 114 generally includes a layer assignment process whereby nets are assigned to specific layers for routing. The routing and optimization operation 114 may further include a layer trimming process 115 prior to layer assignment in which one on or more layers are removed from consideration and not used for routing layer assignment. More specifically, the layer trimming process 115 includes generating a first list of horizontal layers and a second list of vertical layers. Each list is sorted based on respective RC values associated with the layers. The layer trimming process further includes determining an RC constraint for filtering the layers. That is, the one or more layers that are removed from consideration are layers that do not satisfy the RC constraint. The RC constraint comprises a permitted range of values for routing layers and is determined based on a reference value corresponding to an RC value from one of the layers and a maximum difference parameter, which may be a predetermined default value or based on user input. The first and second lists are filtered by removing any layers that have an RC value that is not in the permitted range of RC values defined by the RC constraint. After filtering, the first and second lists are merged to create a third list of routing layers where each routing layer has an RC value that is within the permitted range of RC values. During layer assignment, nets of the design are assigned to one or more layers selected from the third list.

After design inputs are used in the design input operation 112 to generate a circuit layout, and any of the routing and optimization operations 114 are performed, a layout is generated in the layout instance 116. The layout describes the physical layout dimensions of the device that match the design inputs. Prior to this layout being provided to a fabrication operation 122, the signoff 118 is performed on the circuit design defined by the layout.

After signoff verification by the signoff 118, a verified version of the layout is used in the fabrication operation 122 to generate a device, or additional testing and design updates may be performed using designer inputs or automated updates based on design simulation 132 operations or extraction, 3D modeling, and analysis operations 144. Once the device is generated, the device can be tested as part of device test operation 142 and layout modifications generated based on actual device performance.

A design update 136 from the design simulation 132 operations; a design update 146 from the device test operation 142 or the extraction, 3D modeling, and analysis operations 144; or the design input operation 112 may occur after the initial layout instance 116 is generated. In various embodiments, whenever design inputs are used to update or change an aspect of a circuit design, a timing analysis and the routing and optimization operation 114 may be performed.

Figure 2:
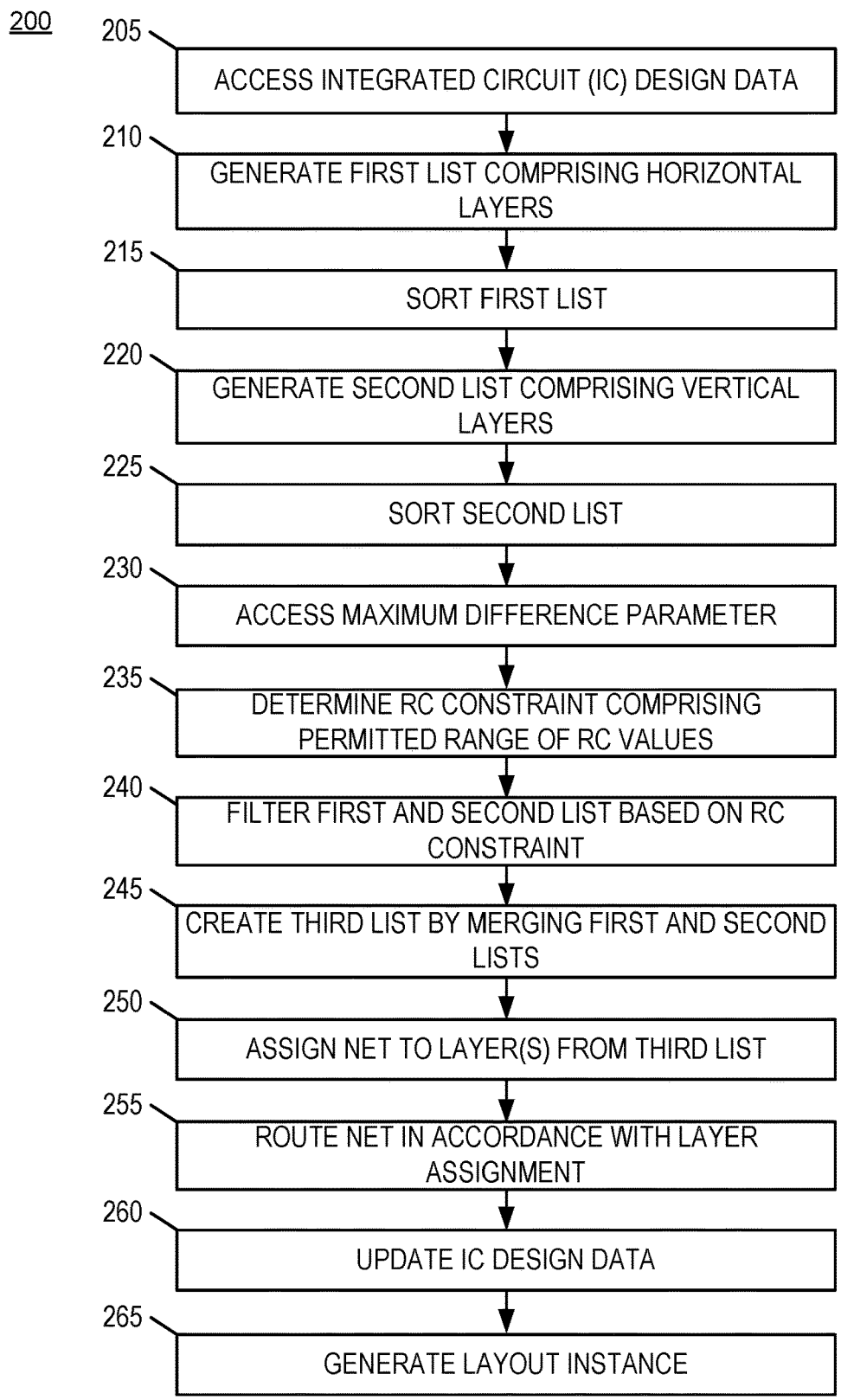
FIGS. 2 and 3 are flowcharts illustrating operations of a method for RC-aware layer trimming, according to some example embodiments.
Figure 3:
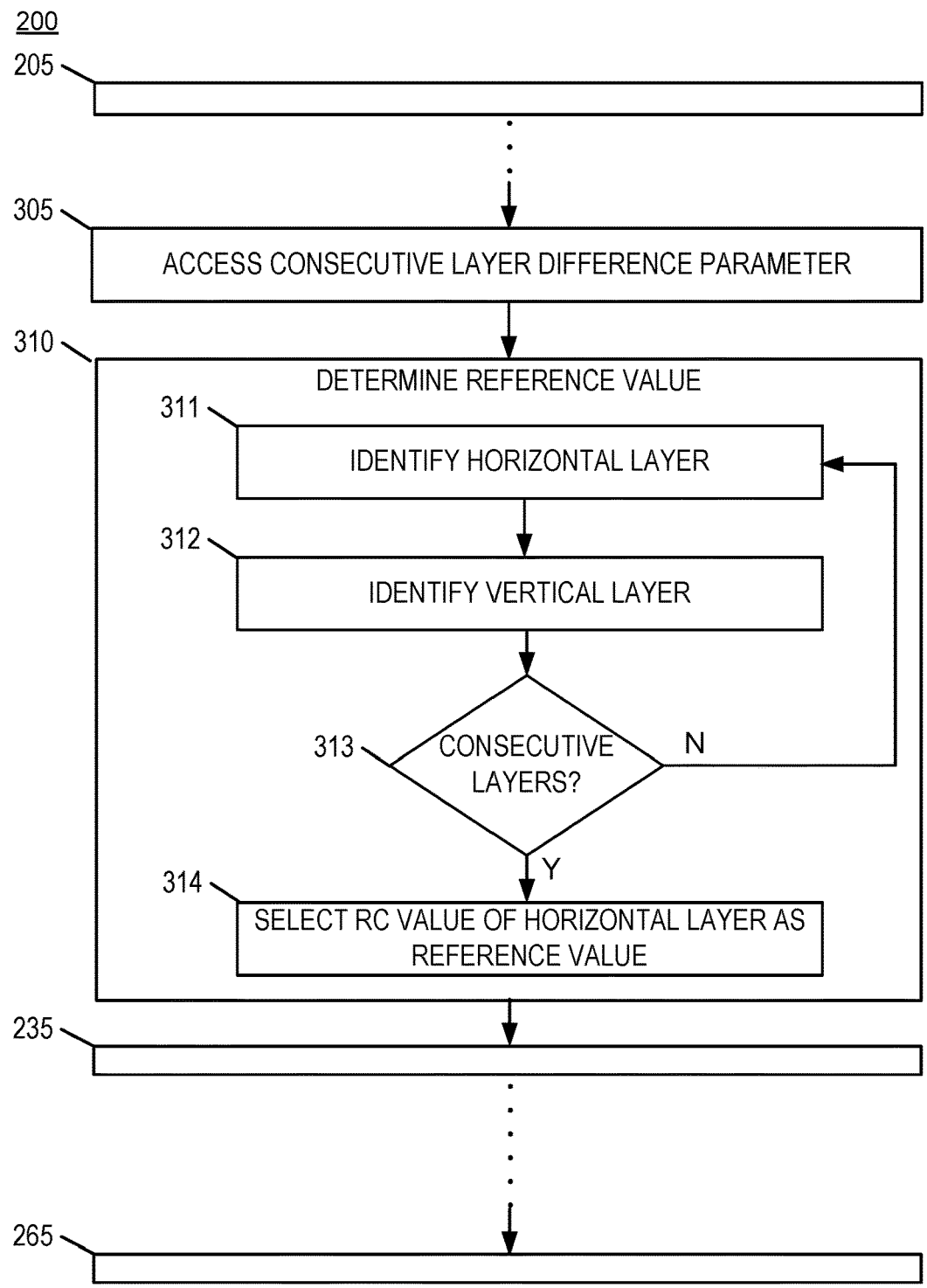

FIGS. 2 and 3 are flowcharts illustrating operations of a method 200 for routing an IC design based on a maximum turn constraint, according to some example embodiments. For some embodiments, the method 200 is performed as part of a placement process applied to a circuit design (e.g., by an EDA software system). It will be understood that the method 200 may be performed by a device, such as a computing device executing instructions of an EDA software system. For instance, the operations the method 200 may be represented by executable instructions (e.g., EDA software) that, when executed by a processor of a computing device, cause the computing device to perform the method. Thus, an operation of the method 200 may be performed by a hardware processor (e.g., central processing unit or graphics processing unit) of a computing device (e.g., desktop, server, etc.). Accordingly, the method 200 is described below with reference to such a computing device.

Depending on the embodiment, an operation of the method 200 may be repeated in different ways or involve intervening operations not shown. Though the operations of the method 200 may be depicted and described in a certain order, the order in which the operations are performed may vary among embodiments, including performing certain operations in parallel.

The method 200 as illustrated begins at operation 205 where the computing device accesses data describing an integrated circuit (IC) design (also referred to herein as "IC design data") from memory. The IC design data can comprise or correspond to one or more IC design files stored in memory. The IC design data includes a net specifying a connection between two pins-a first pin and a second pin. The net may be included among a set of nets specified by a netlist in the IC design.

The IC design data further specifies a set of layers in which nets of the IC design can be routed. The set of layers may correspond to layers that are designated as "priority routing layers," which can be based on user input. Layers with priority routing layer designations are treated with higher priority when performing layer assignment than layers without such designations. That is, when performing layer assignments for nets in the IC design, priority is given to the layers designated as priority routing layers. The set of layers includes at least one horizontal layer and at least one vertical layer. Each layer is associated an RC value. An RC value for a given layer provides a measure of resistance and capacitance characteristics of the layer and can comprise a combination of a resistance value and a capacitance value associated with the layer.

At operation 210, the computing device generates a first list comprising horizontal layers from the set of layers, and at operation 215, the computing device sorts the first list based on RC values associated with the horizontal layers. For example, the computing device may sort the first list of horizontal layers in descending order from lowest RC value to highest RC value.

At operation 220, the computing device generates a second list comprising vertical layers from the set of layers, and at operation 225 the computing device sorts the second list based on RC values associated with vertical layers. For example, the computing device may sort the second list of vertical layers in descending order from lowest RC value to highest RC value.

In some instances, one or more RC values may change slightly (e.g., based on other iterations of the method 200 or other optimizations performed on the IC design). However, slight changes (e.g., changes below a threshold value) to any one or more of the RC values does not impact the sort order of either the first or second list.

The computing device, at operation 230, accesses a maximum difference parameter associated with the integrated circuit design. The maximum difference parameter specifies a value corresponding to a maximum permitted difference between an RC value of a layer and the reference value. For some embodiments, the maximum difference parameter expresses the permitted maximum difference as a percentage.

The computing device, at operation 235, determines an RC constraint comprising a permitted range of RC values for routing layers in the IC design. The computing device determines the permitted range based on a reference value and the maximum difference parameter. The reference value corresponds to an RC value of one of the layers in the first or second list and may be selected based on a consecutive layer difference parameter. The consecutive layer difference parameter comprises a value that specifies a maximum difference in RC values between consecutive layers. For some embodiments, the consecutive layer difference parameter expresses the maximum difference as a percentage.

For some embodiments, the maximum difference parameter can be received from a user via an user interface provided by the computing device. For some embodiments, the maximum difference parameter can be a default value. The computing device can access the maximum difference parameter from the IC design data or another location in memory. Further details regarding determining the RC constraint.

To determine the permitted range of RC values, the computing device determines a delta value and uses the delta value to determine a minimum RC value and a maximum RC value. In embodiments in which the maximum difference parameter expresses the permitted difference as a percentage, the computing device converts the permitted difference to a decimal value and multiples the reference value by the decimal value. To determine the minimum RC value for the permitted range of RC values, the computing device subtracts the maximum difference parameter value from the reference value. To determine the maximum RC value for the permitted range of RC values, the computing device adds the maximum difference parameter value to the reference value.

At operation 240, the computing device filters the first list and the second list based on the permitted range of RC values. The filtering of the first list includes removing one or more layers from one or more of the first list or the second list. More specifically, the computing device can remove a layer from either the first or second list based on an RC value associated with the layer not being in the permitted range of RC values.

The computing device creates a third list by merging the filtered first and second lists, at operation 245. The third list comprises a set of routing layers in which nets of the IC design can be routed. The set of routing layers corresponds to a subset of the set of layers that satisfy the RC constraint. That is, the RC value of each routing layer in the third list is in the permitted range of RC values.

The computing device performs layer assignment based on the routing layers in the third list. For example, as shown, the computing device assigns the net to one or more routing layers selected from the third list, at operation 250. The computing device routes the net in accordance with the one or more routing layers to which the net is assigned, at operation 255. That is, the computing device determines a connection path between the first pin and the second pin within the one or more routing layers from the third list.

At operation 260, the computing device updates the IC design data based on the routing of the net. In updating the IC design data, the computing device updates the IC design data with data describing the routed net. The computing device, at operation 265, generates a design layout instance for the IC device design based in part on the routed net. The layout describes the physical layout dimensions of the IC device.

As shown in FIG. 3, the method 200 may, in some embodiments, further include operations 305 and 310. For some embodiments, the operations 305 and 310 are performed prior to operation 235 where the computing device determines the RC constraint. At operation 305, the computing device accesses the consecutive layer difference parameter. For some embodiments, the consecutive layer difference parameter can be received from an user via an user interface provided by the computing device. For some embodiments, the consecutive layer difference parameter can be a default value. The computing device can access the consecutive layer difference parameter from the IC design data or another location in memory.

At operation 310, the computing device determines the reference value based on the set of layers and the consecutive layer difference parameter. As shown, the operation 310 comprises operations 311-314. At operation 311, the computing device identifies a horizontal layer from the first list. The computing device can identify the horizontal layer based on RC values of the horizontal layer in the first list. For example, in an initial iteration, the horizontal layer corresponds to the horizontal layer with the lowest RC value among horizontal layers in the first list.

The computing device identifies a vertical layer from the second list with an RC value that satisfies the consecutive layer difference parameter relative to the horizontal layer, at operation 312. That is, the difference between a first RC value associated with the horizontal layer and a second RC value associated with the vertical layer does not exceed the maximum difference defined by the consecutive layer difference parameter.

At operation 313, the computing device determines whether the horizontal and vertical layers are consecutive. If the computing device determines that the vertical layer and the horizontal layer are not consecutive, the method returns to operation 311 where the computing device identifies another horizontal layer from the first list. For example, the computing device may identifier the horizontal layer with the next lowest RC values. For some embodiments, the computing device may traverse the first list in sorted order in performing subsequent iterations of operation 311.

Based on determining the difference in RC values between the horizontal and vertical layer satisfy the difference ratio and that the horizontal and vertical layers are consecutive, the computing device selects the RC value associated with the horizontal layer as the reference value, at operation 314.

FIGS. 4A and 4B are conceptual diagrams illustrating a first example of RC-aware layer trimming performed in accordance with the method 200 described above. In this example, the integrated circuit design comprises layers L5-L14, each of which has an associated RC value, as shown. Further, in this example, the consecutive layer difference parameter specifies a maximum difference of 10% between consecutive layers and the maximum difference parameter specifies a permitted difference of 15% between a routing layer and a reference value. As shown in FIG. 4A, the layers L5-L14 are organized into list 400 and list 450. List 400 comprises horizontal layers (L5, L7, L9, L11, and L13) and list 450 comprises vertical layers (L6, L8, L10, L12, and L14). The lists 400 and 450 are sorted based on respective RC values of the layers. More specifically, the lists are sorted by RC value in descending order.

As discussed above, an RC value from one of the lists 400 and 450 is selected as a reference value and used to determine a permitted range of RC values. In this example, the RC value of 80 from L11 is selected as the reference value. Here, though the lowest RC value in the list 400 is 70 (the RC value of L13); this is not selected as the reference value because the RC value associated with L14, which is a consecutive layer to L13, does not satisfy the maximum difference of 10% specified by the difference ratio (70-30>10% of 70). However, the next lowest RC value of 80, which corresponds to L11, is within the 10% maximum difference of the RC value of the consecutive layer L12, which is also 80. Hence, 80 is selected as the reference value. Given the reference value of 80 and the maximum difference parameter specifying 15%, the delta value is 12 (0.15*80). Hence, the RC constraint comprising the permitted range of RC values is computed as follows:

Permitted Range of RC Values=[(80-12), (80+12)]

Accordingly, the lists 400 and 450 are filtered by removing any layer with an RC value that is not in the range of [68, 92]. Thus, L5, L6, and L14 are are not included in filtered lists 402 and 452, as shown in FIG. 4B. Although not specifically illustrated, in FIGS. 4A and 4B, it shall be understood that the filtered lists 402 and 452 are merged to create a third lists of routing layers, from which the net is assigned to one or more routing layers.

Figure 5A:
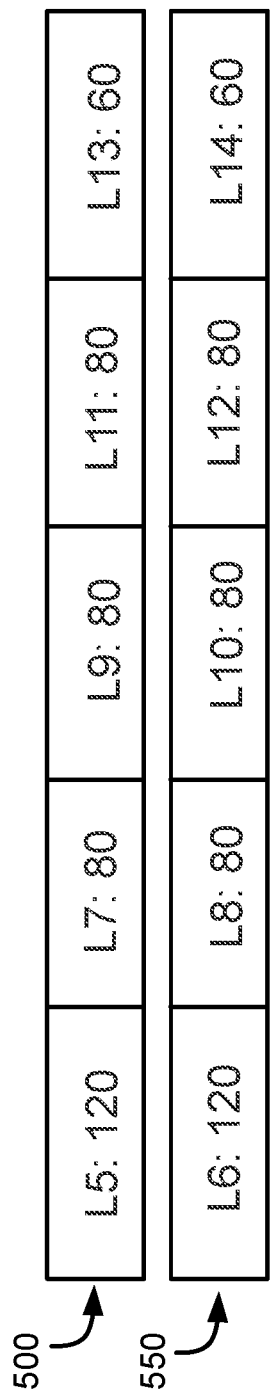
FIGS. 5A and 5B are conceptual diagrams illustrating a second example of RC-aware layer trimming, according to some example embodiments.
Figure 5B:
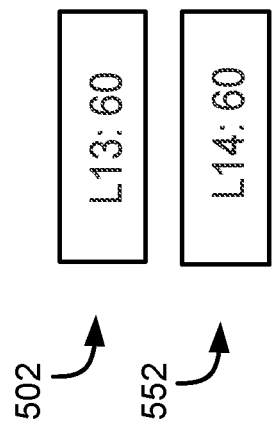

FIGS. 5A and 5B are conceptual diagrams illustrating a second example of RC-aware layer trimming performed in accordance with the method 200 described above. In this example, the integrated circuit design comprises layers L5-L14, each of which has an associated RC value, as shown. Further, in this example, the consecutive layer difference parameter specifies a maximum difference of 10% between consecutive layers and the maximum difference parameter specifies a permitted difference of 15% between a routing layer and a reference value. As shown, the layers L5-L14 are organized into list 500 and list 550. List 500 comprises horizontal layers (L5, L7, L9, L11, and L13) and list 550 comprises vertical layers (L6, L8, L10, L12, and L14). The lists 500 and 550 are sorted based on respective RC values of the layers. More specifically, the lists are sorted by RC value in descending order.

In this example, the RC value of 60 from L13 is selected as the reference value because the consecutive layer L14 has an RC value of 60, which is within 10% of the RC value of L13. Given the reference value of 60 and the maximum difference parameter specifying 15%, the delta value is 9 (0.15*60). Hence, the RC constraint comprising the permitted range of RC values is computed as follows:

Permitted Range of RC Values=[(60-9), (60+9)]

Accordingly, the lists 500 and 550 are filtered by removing any layer with an RC value that is not in the range of [51, 69]. Thus, L5-L12 are not included in filtered lists 502 and 552, as shown in FIG. 5B. Although not specifically illustrated, in FIGS. 5A and 5B, it shall be understood that the filtered lists 502 and 552 can be merged to create a third lists of routing layers, from which the net is assigned to one or more routing layers.

Figure 6:
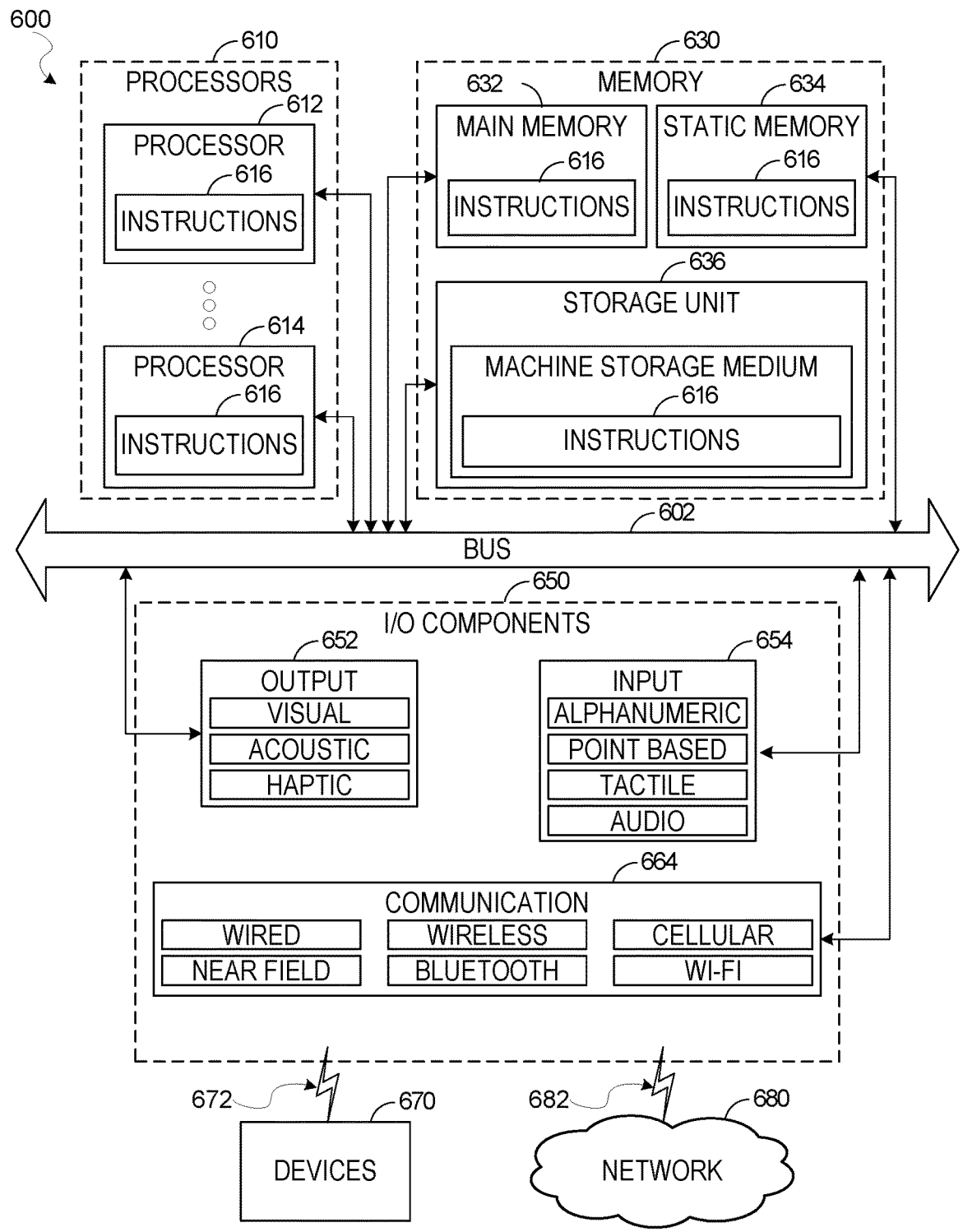
FIG. 6 is a diagrammatic representation of a machine in the example form of a computer system within which a set of instructions for causing the machine to perform any one or more of the methodologies discussed herein may be stored and executed.

FIG. 6 illustrates a diagrammatic representation of a machine 600 in the form of a computer system within which a set of instructions may be executed for causing the machine 600 to perform any one or more of the methodologies discussed herein, according to an example embodiment. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein may be executed. For example, the instructions 616 may cause the machine 600 to execute an EDA software system that executes the method 200. Additionally, or alternatively, the instructions 616 may implement the design flow of FIG. 1. The instructions 616 transform the general, non-programmed machine 600 into a particular machine 600 programmed to carry out the described and illustrated functions in the manner described here. In alternative embodiments, the machine 600 operates as a standalone device or may be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

The machine 600 may include processors 610, memory 630, and I/O components 650, which may be configured to communicate with each other such as via a bus 602. In an example embodiment, the processors 610 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 612 and a processor 614 that may execute the instructions 616. The term "processor" is intended to include multi-core processors 610 that may comprise two or more independent processors (sometimes referred to as "cores") that may execute instructions contemporaneously. Although FIG. 6 shows multiple processors, the machine 600 may include a single processor with a single core, a single processor with multiple cores (e.g., a multi-core processor), multiple processors with a single core, multiple processors with multiple cores, or any combination thereof.

The memory 630 may include a main memory 632, a static memory 634, and a storage unit 636, each accessible to the processors 610 such as via the bus 602. The main memory 632, the static memory 634, and the storage unit 636 store the instructions 616 embodying any one or more of the methodologies or functions described herein. The instructions 616 may also reside, completely or partially, within the main memory 632, within the static memory 634, within the storage unit 636, within at least one of the processors 610 (e.g., within the processor's cache memory), or any suitable combination thereof, during execution thereof by the machine 600.

The I/O components 650 may include a wide variety of components to receive input, provide output, produce output, transmit information, exchange information, capture measurements, and so on. The specific I/O components 650 that are included in a particular machine will depend on the type of machine. For example, portable machines such as mobile phones will likely include a touch input device or other such input mechanisms, while a headless server machine will likely not include such a touch input device. It will be appreciated that the I/O components 650 may include many other components that are not shown in FIG. 6. The I/O components 650 are grouped according to functionality merely for simplifying the following discussion, and the grouping is in no way limiting. In various example embodiments, the I/O components 650 may include output components 652 and input components 654. The output components 652 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components, and so forth. The input components 654 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 650 may include communication components 664 operable to couple the machine 600 to a network 680 or devices 670 via a coupling 682 and a coupling 672, respectively. For example, the communication components 664 may include a network interface component or another suitable device to interface with the network 680. In further examples, the communication components 664 may include wired communication components, wireless communication components, cellular communication components, and other communication components (NFC, Bluetooth, and Wi-Fi) to provide communication via other modalities. The devices 670 may be another machine or any of a wide variety of peripheral devices (e.g., a peripheral device coupled via a universal serial bus (USB)).

Executable Instructions and Machine-Storage Medium

The various memories (e.g., 630, 632, 634, and/or memory of the processor(s) 610) and/or the storage unit 636 may store one or more sets of instructions and data structures (e.g., software) embodying or utilized by any one or more of the methodologies or functions described herein. These instructions, when executed by the processor(s) 610, cause various operations to implement the disclosed embodiments.

The terms "machine-storage medium," "device-storage medium," and "computer storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "transmission medium" discussed below.

Transmission Medium

In various example embodiments, one or more portions of the network 680 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public-switched telephone network (PSTN), a plain old telephone service (POTS) network, a cellular telephone network, a wireless network, a Wi-Fi® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling. In this example, the coupling 682 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 616 may be transmitted or received over the network 680 using a transmission medium via a network interface device (e.g., a network interface component included in the communication components 664) and utilizing any one of a number of well-known transfer protocols (e.g., hypertext transfer protocol (HTTP)). Similarly, the instructions 616 may be transmitted or received using a transmission medium via the coupling 672 (e.g., a peer-to-peer coupling) to the devices 670. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 616 for execution by the machine 600, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
    one or more processors of a machine; and
    a computer storage medium storing instructions, which when executed by the machine, cause the machine to perform operations comprising:
    accessing, from memory, data describing an integrated circuit design, the integrated circuit design comprising a net and a set of layers;
    generating, based on the set of layers, a first list comprising horizontal layers from the set of layers;
    generating, based on the set of layers, a second list comprising vertical layers from the set of layers;
    determining a resistance and capacitance (RC) constraint comprising a permitted range of RC values for routing layers in the integrated circuit design, the determining of the RC constraint comprising:
        determining a delta value based on a reference value and a maximum difference parameter, the maximum difference parameter specifying a maximum permitted difference between an RC value and the reference value;
        determining a minimum permitted RC value by subtracting the delta value from the reference value; and
        determining a maximum permitted RC value by adding the delta value to the reference value;
    filtering the first list and the second list based on the RC constraint the filtering comprising removing one or more layers that fail to satisfy the RC constraint from one or more of the first list and the second list;
    merging the first list and the second list to create a third list of routing layers, the third list of routing layers comprising a subset of the set of layers; and
    assigning the net to one or more routing layers selected from the third list.

2. The system of claim 1, wherein the operations further comprise:
sorting the first list based on the RC values of the horizontal layers; and
sorting the second list based on the RC values of the vertical layers.

3. The system of claim 1, wherein the operations further comprise:
accessing a consecutive layer difference parameter specifying a maximum difference between RC values of consecutive layers;
determining the reference value based on the set of layers and the consecutive layer difference parameter.

4. The system of claim 3, wherein determining the reference value comprises:
identifying a horizontal layer from the first list;
identifying the vertical layer from the second list that satisfies the consecutive layer difference parameter relative to the horizontal layer;
determining the horizontal layer and the vertical layer are consecutive layers; and
based on the vertical layer satisfying the consecutive layer difference parameter relative to the horizontal parameter and determining the horizontal layer and the vertical layer are consecutive layers, selecting an RC value associated with the horizontal layer as the reference value.

5. The system of claim 4, wherein the horizontal layer corresponds to a lowest RC value among horizontal layers in the first list.

6. The system of claim 3, wherein the operations further comprise:
receiving, from a user, the maximum difference parameter.

7. The system of claim 1, wherein the removing of the one or more layers from one or more of the first list and second list that fail to satisfy the RC constraint comprises determining the RC value associated a layer is not in the permitted range of RC values.

8. The system of claim 1, wherein the set of layers correspond to layers with a priority routing layer designation specified by a user.

9. The system of claim 1, wherein the operations further comprise:
routing the net in accordance with the one or more routing layers to which the net is assigned.

10. The system of claim 9, wherein the operations further comprise:
generating a layout instance for an integrated circuit device based on the integrated circuit design based in part on routing the net, the layout instance describing physical dimensions of the integrated circuit device.

11. A method comprising:
accessing, from memory, data describing an integrated circuit design, the integrated circuit design comprising a net and a set of layers;
generating, based on the set of layers, a first list comprising horizontal layers from the set of layers;
generating, based on the set of layers, a second list comprising vertical layers from the set of layers;
determining a resistance and capacitance (RC) constraint comprising a permitted range of RC values for routing layers in the integrated circuit design, the determining of the RC constraint comprising:
determining a delta value based on a reference value and a maximum difference parameter, the maximum difference parameter specifying a maximum permitted difference between an RC value and the reference value;
determining a minimum permitted RC value by subtracting the delta value from the reference value; and
determining a maximum permitted RC value by adding the delta value to the reference value;
filtering the first list and the second list based on the RC constraint;
creating a third list of routing layers by merging the first list and the second list, the third list of routing layers comprising a subset of the set of layers; and
performing layer assignment using the third list of routing layers.

12. The method of claim 11, further comprising:
sorting the first list based on the RC values of the horizontal layers; and
sorting the second list based on the RC values of the vertical layers.

13. The method of claim 11, further comprising:
accessing a consecutive layer difference parameter specifying a maximum difference between the RC values of consecutive layers;
determining the reference value based on the set of layers and the consecutive layer difference parameter.

14. The method of claim 13, wherein determining the reference value comprises:
identifying a horizontal layer from the first list;
identifying a vertical layer from the second list that satisfies the consecutive layer difference parameter relative to the horizontal layer;
determining the horizontal layer and the vertical layer are consecutive layers; and
based on the vertical layer satisfying the consecutive layer difference parameter relative to the horizontal parameter and determining the horizontal layer and the vertical layer are consecutive layers, selecting an RC value associated with the horizontal layer as the reference value.

15. The method of claim 13, further comprising receiving, from a user, the maximum difference parameter.

16. The method of claim 11, wherein:
the performing of the layer assignment includes assigning the net to one or more routing layers selected from the third list; and
the method further comprises routing the net in accordance with the one or more routing layers to which the net is assigned.

17. The method of claim 16, further comprising generating a layout instance for an integrated circuit device based on the integrated circuit design based in part on routing the net, the layout instance describing physical dimensions of the integrated circuit device.

18. A computer storage medium storing instructions, which when executed by a machine, cause the machine to perform operations comprising:
accessing, from memory, data describing an integrated circuit design, the integrated circuit design comprising a net and a set of layers;
generating, based on the set of layers, a first list comprising horizontal layers from the set of layers;
generating, based on the set of layers, a second list comprising vertical layers from the set of layers;
determining a resistance and capacitance (RC) constraint comprising a permitted range of RC values for routing layers in the integrated circuit design, the determining of the RC constraint comprising:

determining a delta value based on a reference value and a maximum difference parameter, the maximum difference parameter specifying a maximum permitted difference between an RC value and the reference value:

determining a minimum permitted RC value by subtracting the delta value from the reference value; and determining a maximum permitted RC value by adding the delta value to the reference value;

filtering the first list and the second list based on the RC constraint;

creating a third list of routing layers by merging the first list and the second list, the third list of routing layers comprising a subset of the set of layers; and performing layer assignment using the third list of routing layers.

19. The computer storage medium of claim 18, wherein the operations further comprise:

sorting the first list based on the RC values of the horizontal layers; and sorting the second list based on the RC values of the vertical layers.

20. The computer storage medium of claim 18, wherein the operations further comprise:

accessing a consecutive layer difference parameter specifying a maximum difference between the RC values of consecutive layers; and determining the reference value based on the set of layers and the consecutive layer difference parameter, the determining of the reference value comprising:

identifying a horizontal layer from the first list;

identifying a vertical layer from the second list that satisfies the consecutive layer difference parameter relative to the horizontal layer;

determining the horizontal layer and the vertical layer are consecutive layers; and based on the vertical layer satisfying the consecutive layer difference parameter relative to the horizontal parameter and determining the horizontal layer and the vertical layer are consecutive layers, selecting an RC value associated with the horizontal layer as the reference value.

* * * * *